(12) United States Patent
Cho

(10) Patent No.: US 7,348,255 B2
(45) Date of Patent: Mar. 25, 2008

(54) SEMICONDUCTOR DEVICE AND METHOD FOR FABRICATING A SEMICONDUCTOR DEVICE

(75) Inventor: Jun-Hee Cho, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 63 days.

(21) Appl. No.: 11/321,925

(22) Filed: Dec. 28, 2005

(65) Prior Publication Data

US 2006/0292819 A1    Dec. 28, 2006

(30) Foreign Application Priority Data

Jun. 27, 2005    (KR) .................. 10-2005-0055863

(51) Int. Cl.
*H01L 21/76*    (2006.01)

(52) U.S. Cl. .................. 438/424; 438/74; 438/404; 438/481; 438/570; 257/E21.564

(58) Field of Classification Search .................. 438/74, 438/481, 337, 188, 429, 404; 257/E21.564
See application file for complete search history.

(56) References Cited

U.S. PATENT DOCUMENTS

| 6,228,691 B1 * | 5/2001 | Doyle .................. 438/149 |
| 6,919,258 B2 * | 7/2005 | Grant et al. .................. 438/407 |
| 7,029,964 B2 * | 4/2006 | Cheng et al. .................. 438/197 |

* cited by examiner

*Primary Examiner*—Scott B. Geyer
*Assistant Examiner*—Seahvosh Nikmanesh
(74) *Attorney, Agent, or Firm*—Blakely, Sokoloff, Taylor & Zafman

(57) ABSTRACT

A semiconductor structure has an active region on a substrate, and recessed portions are formed at lower edges of lateral portions of the semiconductor structure. Patterned first insulation layers for device isolation are buried into the recessed portions. Second insulation layers for device isolation are formed on sidewalls of the first insulation layers.

10 Claims, 6 Drawing Sheets

SEMICONDUCTOR DEVICE AND METHOD FOR FABRICATING A SEMICONDUCTOR DEVICE

The present application contains subject matter related to the Korean patent application No. KR 2005-0055863, filed in the Korean Patent Office on Jun. 27, 2005, the entire contents of which being incorporated herein by reference.

FIELD OF THE INVENTION

An embodiment of the invention relates to semiconductor device fabrication technologies. Other embodiments are also described and claimed.

DESCRIPTION OF RELATED ARTS

Typically, semiconductor devices include a number of unit devices or cells. As the semiconductor devices become highly integrated, the unit devices should be formed with high density on a fixed cell area. Accordingly, the sizes of the unit devices, e.g., transistors and capacitors, have decreased. In semiconductor devices such as dynamic random access memory (DRAM) devices, as the design rule has been decreased, the sizes of the unit devices formed inside of the cell have also decreased. Recently, the unit device has reached a minimum line width that is smaller than 0.1 µm, e.g. smaller than 70 nm. Accordingly, a length of a transistor channel has been shortened due to the decreased design rule, thereby inducing a decrease in refresh time.

FIG. 1 is a cross-sectional view illustrating a process for fabricating a conventional semiconductor device.

As shown in FIG. 1, multiple device isolation layers 102 in a substrate 101 on either side of an active region are formed.

Regarding the formation of the device isolation layers 102, a shallow trench isolation (STI) process is performed in the substrate 101, thereby forming a trench. Then, a buffer oxide layer, a nitride layer for insulation, and a liner oxide layer are sequentially deposited into the trench and afterwards, a high density plasma (HDP) oxide layer is buried into the trench through a chemical vapor deposition (CVD) method.

Next, the HDP oxide layer is planarized by performing a chemical mechanical polishing (CMP) process and afterwards, the buffer oxide layer, the nitride layer for the insulation, and the liner oxide layer existing on the substrate 101 except for the trench are removed, thereby forming the device isolation layers 102.

Next, a gate insulation layer 103 and a gate conductive layer 104 are sequentially deposited on the substrate 101 provided with the device isolation layers 102 and then, a selective etching process is performed, thereby forming a gate pattern 105 on the active region of the substrate 101.

Next, impurities are implanted into the substrate 101 exposed on both sides of the gate pattern 105 and thus, a plurality of source/drain regions 106 are formed. Afterwards, a plurality of spacers 107 are formed on sidewalls of the gate pattern 105.

The conventional semiconductor unit device induces limitations including a junction leakage and a short channel effect as a DRAM device has been highly integrated.

Furthermore, due to the aforementioned limitations, an increase in a parasitic capacitance and degradation in a punch through property may occur, thereby degrading a refresh property of the DRAM device.

SUMMARY OF THE INVENTION

An embodiment of the invention is a semiconductor device that may be capable of improving a refresh property through a decrease in a parasitic capacitance and an improvement of a punch through property. A method for fabricating such a device is also described.

In accordance with one aspect of the present invention, there is provided a semiconductor device, including: a semiconductor structure providing an active region by being formed on a substrate, and including recessed portions formed at lower edges of lateral portions of the semiconductor structure; a number of patterned first insulation layers for device isolation buried into the recessed portions; and a number of second insulation layers for device isolation formed on sidewalls of the first insulation layers and the semiconductor structure.

In accordance with another aspect of the present invention, there is provided a semiconductor device, including: a semiconductor structure providing an active region by being formed on a substrate and including recessed portions formed at lower edges of lateral portions of the semiconductor structure; and a number of insulation layers for device isolation formed to be aligned with upper edges of the semiconductor structure.

In accordance with further aspect of the present invention, there is provided a method for fabricating a semiconductor device, including: forming a number of patterned first insulation layers opening a predetermined portion on a substrate; forming a first semiconductor layer on the predetermined portion between the patterned first insulation layers; forming a second semiconductor layer on the first semiconductor layer and the patterned first insulation layers; selectively etching the second semiconductor layer and the patterned first insulation layers, thereby obtaining a stacked structure; and forming a plurality of second insulation layers on sidewalls of the stacked structure.

In accordance with still further aspect of the present invention, there is provided a method for fabricating a semiconductor device, including: forming a number of patterned first insulation layers opening a predetermined portion on a substrate; forming a first semiconductor layer on the predetermined portion between the patterned first insulation layers; forming a second semiconductor layer on the first semiconductor layer and the patterned first insulation layers; selectively etching the second semiconductor layer and the patterned first insulation layers; removing the patterned first insulation layers; and forming a plurality of second insulation layers to be aligned with sidewalls of the selectively etched second semiconductor layer.

BRIEF DESCRIPTION OF THE DRAWINGS

The above features of the present invention will become better understood with respect to the following description of the preferred embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

FIGS. 2A to 2E are cross-sectional views illustrating a fabrication process of a semiconductor device in accordance with a first embodiment of the present invention.

Figure 1:
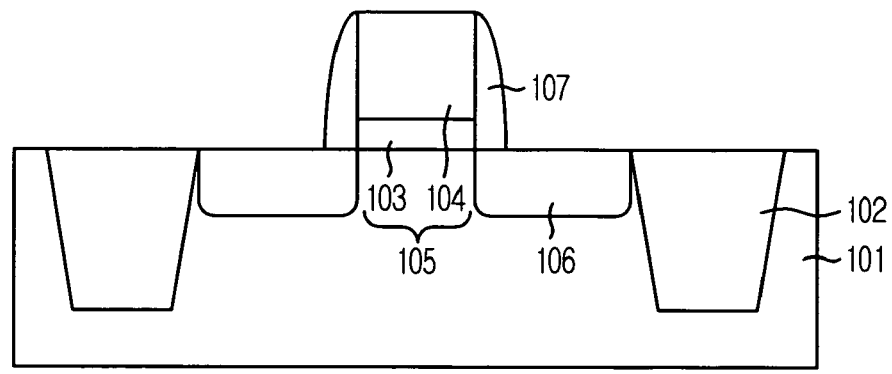
FIG. 1 is a cross-sectional view illustrating a fabrication process of a conventional semiconductor device.
Figure 2A:
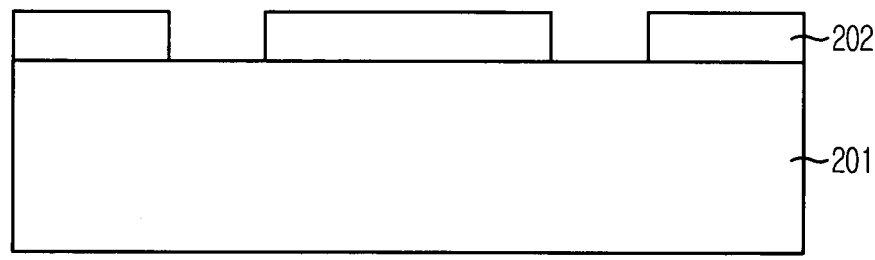
FIGS. 2A to 2E are cross-sectional views illustrating a fabrication process of a semiconductor device in accordance with a first embodiment of the present invention.

In accordance with the first embodiment of the present invention, as shown in FIG. 2A, a number of patterned first insulation layers 202 are deposited on a substrate 201. The formation of the patterned first insulation layers 202 is explained as follows. First, although not shown, a first insulation layer is formed on the substrate 201 and then, the first insulation layer is selectively etched to open regions in which first semiconductor layers will be formed.

At this time, it is preferable that the patterned first insulation layers 202 are dielectric layers including an oxide layer and a nitride layer.

Figure 2B:
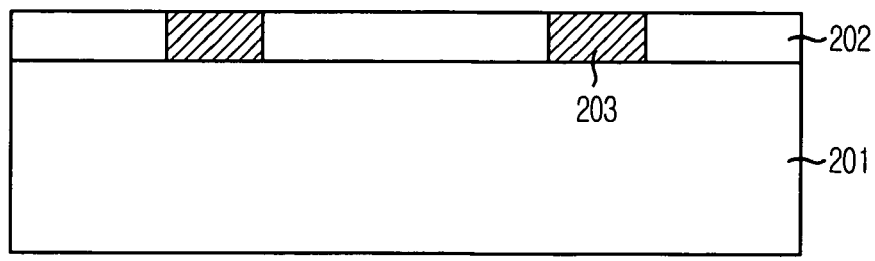

Next, as shown in FIG. 2B, a plurality of first semiconductor layers 203 are formed in the opened regions between the patterned first insulation layers 202.

At this time, it is preferable that the first semiconductor layers 203 are single crystal silicon formed by performing one of a solid phase epitaxy (SPE) process and a silicon epitaxy growth (SEG) process.

Figure 2C:
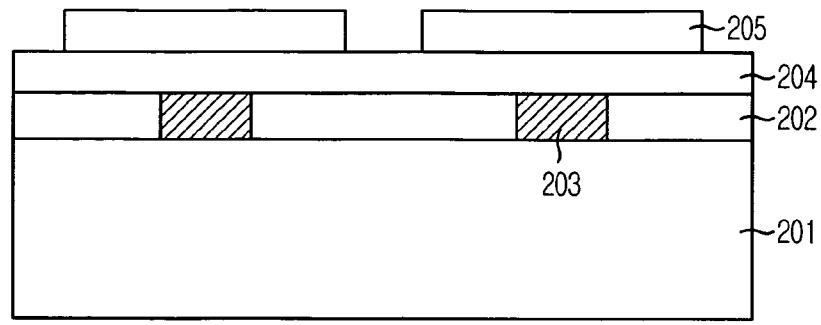

Next, as shown in FIG. 2C, a second semiconductor layer 204 is formed on the first semiconductor layers 203 and the patterned first insulation layers 202.

It is preferable that the second semiconductor layer 204 is silicon formed by performing an epitaxial lateral overgrowth (ELO) process.

Next, a number of photoresist patterns 205 are formed to etch the second semiconductor layer 204 and the patterned first insulation layers 202.

Figure 2D:
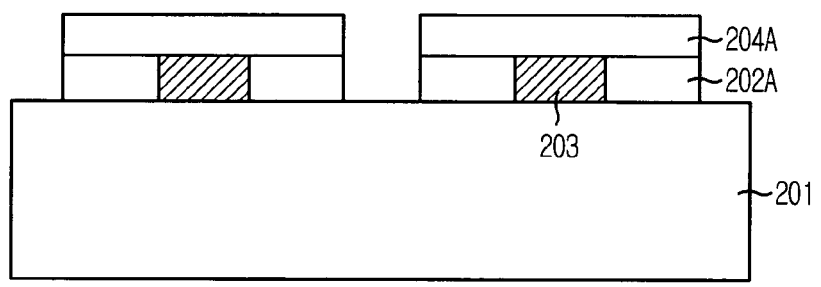

Next, as shown in FIG. 2D, the second semiconductor layer 204 and the patterned first insulation layers 202 are etched by using the photoresist patterns 205 as an etch barrier. Herein, reference numerals 204A and 202A denote the patterned second semiconductor layers and the further patterned first insulation layers, respectively.

Next, the photoresist patterns 205 are removed.

Figure 2E:
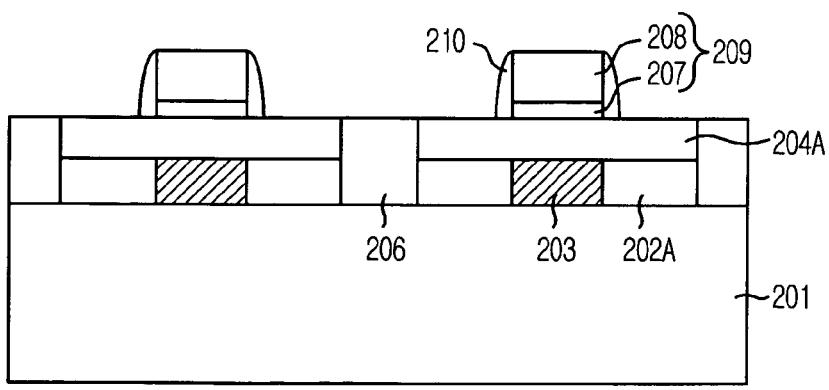

Next, as shown in FIG. 2E, a number of second insulation layers 206 in contact with side walls of the patterned second semiconductor layers 204A and the further patterned first insulation layers 202A are formed on the substrate 201 which is exposed due to the aforementioned etching process.

At this time, it is preferable that the second insulation layers 206 are HDP layers formed through a CVD method.

Next, a number of gate insulation layers 207 and a plurality of gate conductive layers 208 are sequentially formed on the substrate 201 provided with the second insulation layers 206. Then, the gate insulation layers 207 and the gate conductive layers 208 are selectively etched, thereby forming a number of gate patterns 209.

Next, a plurality of source/drain regions (not shown) are formed in the patterned second semiconductor layers 204A exposed on both sides of the gate patterns 209.

FIGS. 3A to 3E are cross-sectional views illustrating a fabrication process of a semiconductor device in accordance with a second embodiment of the present invention.

Figure 3A:
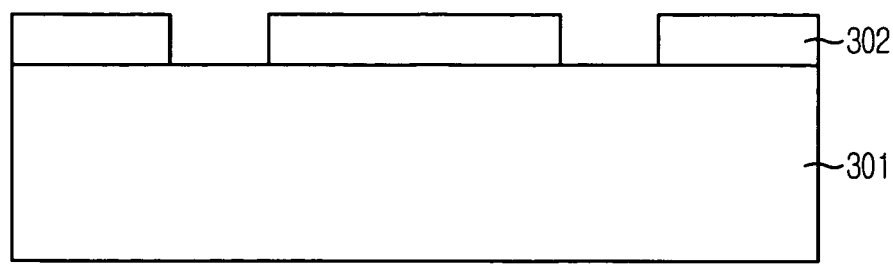
FIGS. 3A to 3E are cross-sectional views illustrating a fabrication process of a semiconductor device in accordance with a second embodiment of the present invention.

In accordance with the second embodiment of the present invention, as shown in FIG. 3A, a number of patterned first insulation layers 302 are deposited on a substrate 301. The formation of the patterned first insulation layers 302 is explained as follows. First, although not shown, a first insulation layer is deposited on the substrate 301 and then, the first insulation layer is selectively etched to open regions in which first semiconductor layers will be formed.

At this time, it is preferable that the patterned first insulation layer 302 is a dielectric layer including an oxide layer and a nitride layer.

Figure 3B:
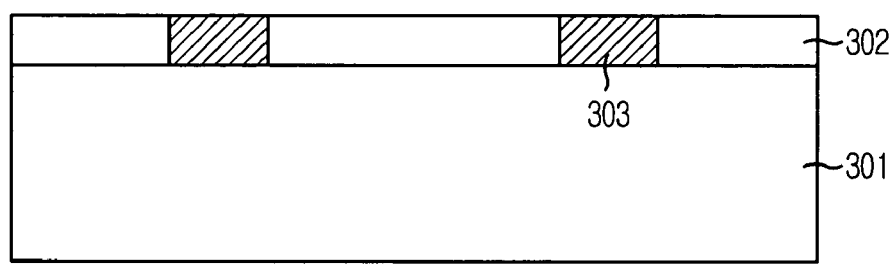

Next, as shown in FIG. 3B, a number of first semiconductor layers 303 are formed in the opened regions between the patterned first insulation layers 302.

At this time, it is preferable that the first semiconductor layers 303 are single crystal silicon formed by performing one of a SPE process and a SEG process.

Figure 3C:
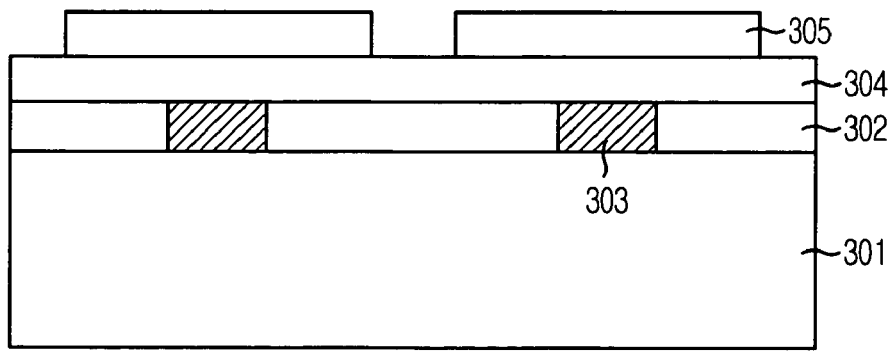

Next, as shown in FIG. 3C, a second semiconductor layer 304 is formed on the first semiconductor layers 303 and the patterned first insulation layers 302.

It is preferable that the second semiconductor layer 304 is silicon formed by performing an ELO process.

Next, a number of photoresist patterns 305 are formed to etch the second semiconductor layer 304 and the patterned first insulation layers 302.

Figure 3D:
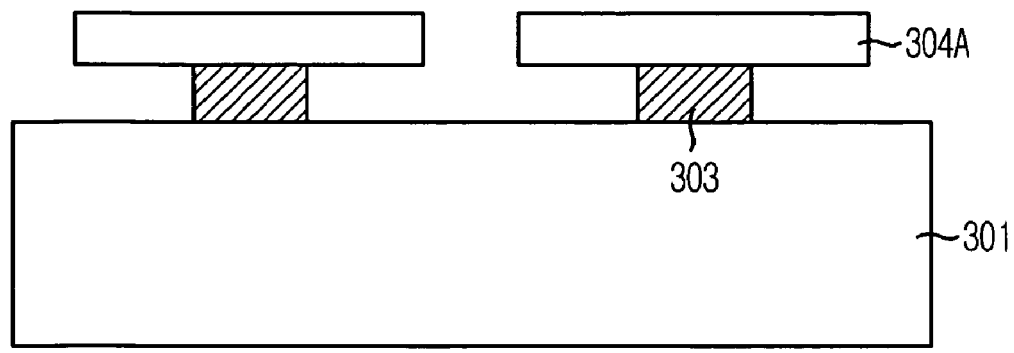

Next, as shown in FIG. 3D, the second semiconductor layer 304 and the patterned first insulation layers 302 are etched by using the photoresist patterns 305 as an etch barrier. Herein, reference numeral 304A denotes the patterned second semiconductor layers.

Next, the photoresist patterns 305 are removed and then, the patterned first insulation layers 302 are removed.

Figure 3E:
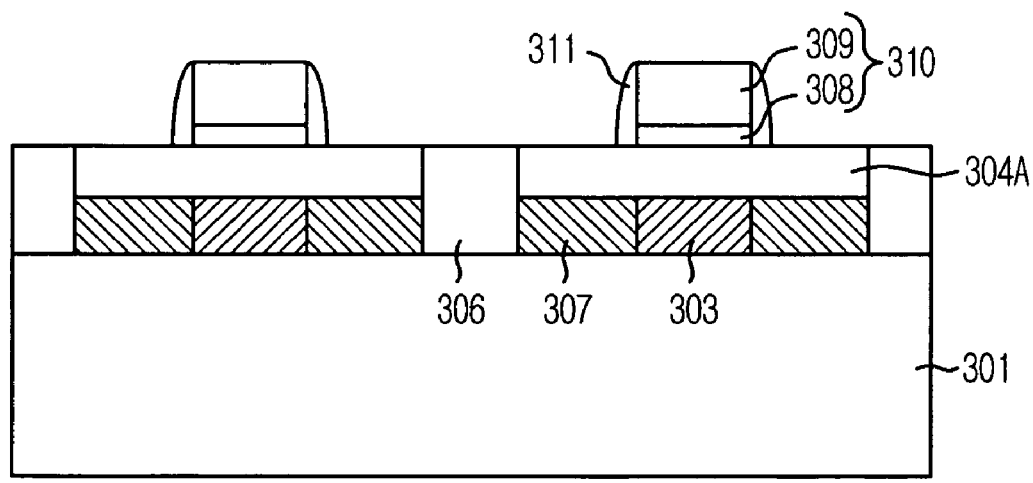

Next, as shown in FIG. 3E, a number of second insulation layers 306 are formed on the substrate 301 (which is exposed due to the aforementioned etching process) to be aligned with both edges of the patterned second semiconductor layers 304A.

At this time, it is preferable that the second insulation layers 306 are HDP layers formed through a CVD method.

Furthermore, regions in which the further patterned first insulation layers 302A are removed become a number of void regions 307.

Next, a number of gate insulation layers 308 and a number of gate conductive layers 309 are sequentially deposited on the substrate 301 provided with the second insulation layers 306.

Next, a number of source/drain regions (not shown) are formed in the patterned second semiconductor layers 304A and afterwards, a number of spacers 311 are formed on sidewalls of the gate patterns 310.

Figure 4:
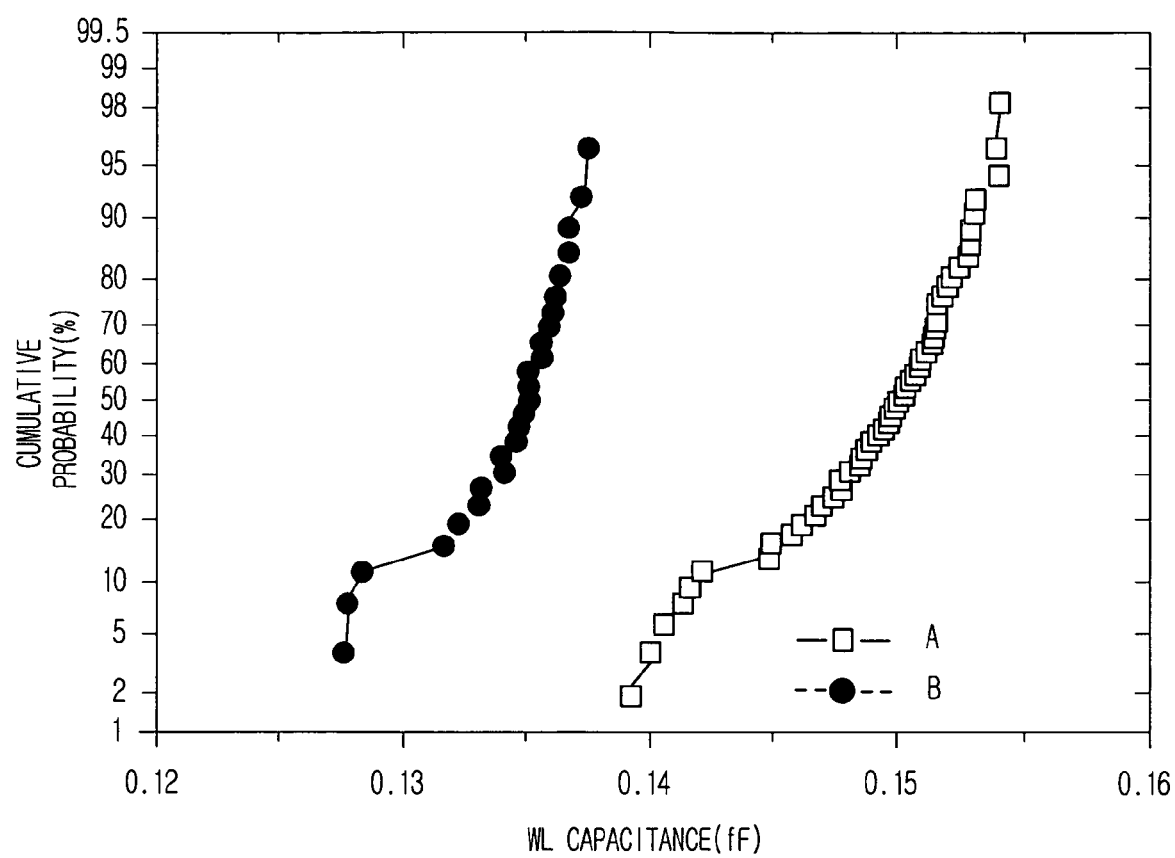
FIG. 4 is a graph exhibiting comparison results of a parasitic capacitance of a word line of the conventional semiconductor device and a semiconductor device in accordance with an embodiment of the present invention.

FIG. 4 is a graph exhibiting comparison results of parasitic capacitance of word lines of a conventional semiconductor device and a semiconductor device in accordance with the present invention.

Referring to FIG. 4, it is shown that the parasitic capacitance of the word line of the conventional semiconductor device group A is larger than that of the semiconductor device group B in accordance with an embodiment of the present invention.

Accordingly, the conventional semiconductor device group may operate slower than the semiconductor device group in accordance with an embodiment of the present invention.

Figure 5:
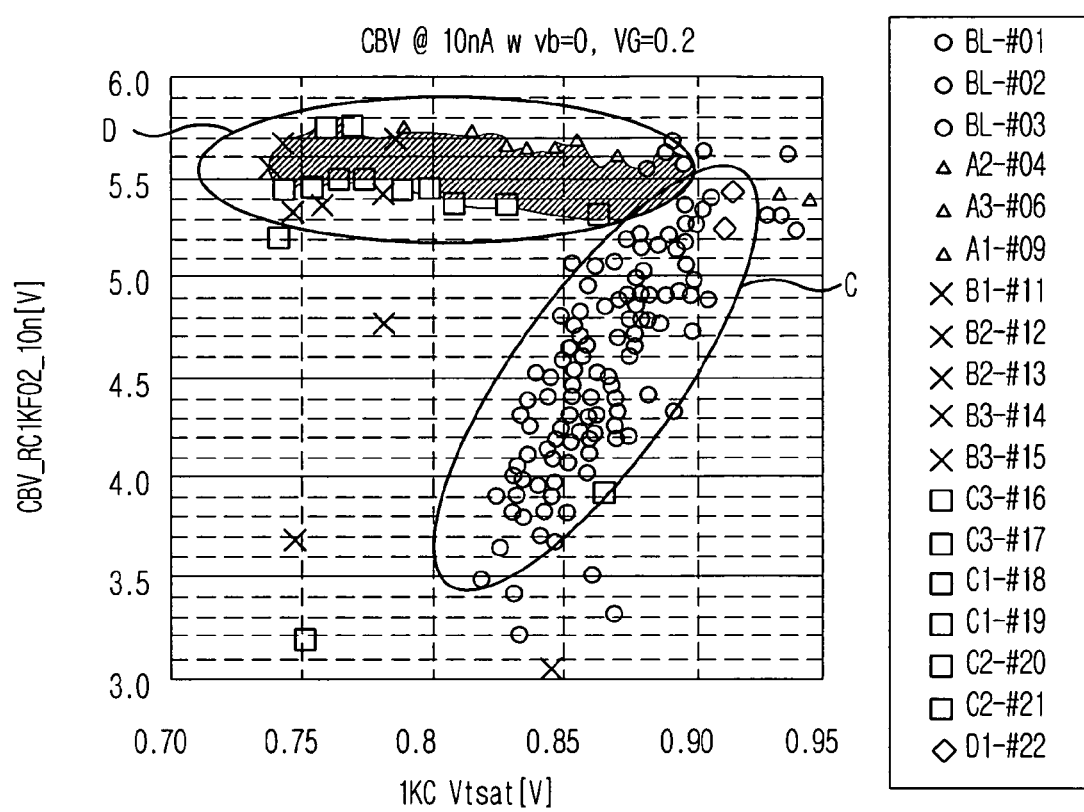
FIG. 5 is a graph exhibiting a punch through property of the conventional semiconductor device and a semiconductor device in accordance with an embodiment of the present invention.

FIG. 5 is a graph exhibiting comparison results of punch through properties of a conventional semiconductor device and a semiconductor device in accordance with the present invention.

Referring to FIG. 5, it is shown that the punch through property of the conventional semiconductor group C is worse than that of the semiconductor device group D which is in accordance with an embodiment of the present invention.

Furthermore, it is also shown that the punch through property is not shown in a predetermined portion of the semiconductor device group B (which is in accordance with an embodiment of the present invention), even at a threshold voltage of approximately 0.75V.

As described above, in accordance with an embodiment of the present invention, a device isolation region of a substrate is largely formed to improve parasitic capacitance and a punch through property.

Accordingly, a refresh time property can be improved due to improvements in the low parasitic capacitance and the punch through property according to a threshold voltage.

As described above, to improve parasitic capacitance and a punch through property, a region in which a device isolation region and an active region of a substrate are two-dimensionally overlapped with each other is formed.

Accordingly, a refresh time property can be improved due to improvements in the low parasitic capacitance and the punch through property according to a threshold voltage.

Due to the improvement in the refresh time, an operation speed and stability of the semiconductor device can be secured.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
    forming a plurality of patterned first insulation layers opening a predetermined portion on a substrate;
    forming a first semiconductor layer on the predetermined portion between the patterned first insulation layers;
    forming a second semiconductor layer on the first semiconductor layer and the patterned first insulation layers;
    selectively etching the second semiconductor layer and the patterned first insulation layers, thereby obtaining a stacked structure; and
    forming a plurality of second insulation layers on sidewalls of the stacked structure.

2. The method of claim 1, wherein the stacked structure comprises a patterned second semiconductor layer, a plurality of further pattered first insulation layers, and the first semiconductor layer.

3. The method of claim 1, wherein said forming the first semiconductor layer comprises growing single crystal silicon by one of a solid phase epitaxy (SPE) process and a silicon epitaxy growth (SEG) process.

4. The method of claim 1, wherein said forming the second semiconductor layer comprises growing silicon by an epitaxial lateral overgrowth (ELO) process.

5. The method of claim 1, wherein said forming the patterned first insulation layers comprises forming one of an oxide layer and a nitride layer.

6. The method of claim 1, wherein said forming the second insulation layers comprises forming a high density plasma (HDP) layer through a chemical vapor deposition (CVD) method.

7. A method for fabricating a semiconductor device, comprising:
    forming a plurality of patterned first insulation layers opening a predetermined portion on a substrate;
    forming a first semiconductor layer on the predetermined portion between the patterned first insulation layers;
    forming a second semiconductor layer on the first semiconductor layer and the patterned first insulation layers;
    selectively etching the second semiconductor layer and the patterned first insulation layers; removing the patterned first insulation layers; and
    forming a plurality of second insulation layers aligned with side walls of the selectively etched second semiconductor layer.

8. The method of claim 7, wherein said forming the first semiconductor layer comprises growing single crystal silicon by one of a solid phase epitaxy (SPE) process and a silicon epitaxy growth (SEG) process.

9. The method of claim 7, wherein said forming the second semiconductor layer comprises growing silicon by an epitaxial lateral overgrowth (ELO) process.

10. The method of claim 7, wherein the forming the second insulation layers comprises forming a high density plasma (HDP) layer through a chemical vapor deposition (CVD) method.

* * * * *